(12) United States Patent
Shelton

(10) Patent No.: US 9,470,721 B1
(45) Date of Patent: Oct. 18, 2016

(54) SYSTEMS AND METHODS FOR CURRENT SENSING ELEMENTS FOR USE IN APPLICATIONS ASSOCIATED WITH DIFFERENT PEAK CURRENT LEVELS

(71) Applicant: Synapse Wireless, Inc., Huntsville, AL (US)

(72) Inventor: Gary Warren Shelton, Huntsville, AL (US)

(73) Assignee: Synapse Wireless, Inc., Huntsville, AL (US)

( * ) Notice: Subject to any disclaimer, the term of this patent is extended or adjusted under 35 U.S.C. 154(b) by 677 days.

(21) Appl. No.: 13/949,489

(22) Filed: Jul. 24, 2013

Related U.S. Application Data

(63) Continuation of application No. 12/973,523, filed on Dec. 20, 2010, now Pat. No. 8,508,071.

(51) Int. Cl.
*H02B 1/24* (2006.01)
*G01R 19/00* (2006.01)

(52) U.S. Cl.
CPC .................................. *G01R 19/00* (2013.01)

(58) Field of Classification Search
CPC ............................ H02H 9/001; H03K 11/166
USPC ......................................................... 307/131
See application file for complete search history.

(56) References Cited

U.S. PATENT DOCUMENTS

| 6,426,617 | B1* | 7/2002 | Haensgen | G01R 15/202 |
| | | | | 324/117 H |
| 2002/0196004 | A1* | 12/2002 | Berson | H02H 9/001 |
| | | | | 323/282 |

OTHER PUBLICATIONS

Gary Warren Shelton, U.S. Appl. No. 12/973,523, entitled, "Systems and Methods for Combining Current from Solar Power Arrays," filed Dec. 20, 2010.

* cited by examiner

*Primary Examiner* — Jared Fureman
*Assistant Examiner* — Duc M Pham
(74) *Attorney, Agent, or Firm* — Maynard Cooper & Gale, P.C.; Jon E. Holland

(57) ABSTRACT

A system for combining current from solar power arrays comprises a combiner element and a plurality of solar power arrays, including at least a first solar power array and a second solar power array. The combiner element is configured to receive and combine current from the solar power arrays thereby providing a combined current signal that is based on current from each of the solar power arrays. The combiner element has a current sensing element coupled to one of the solar power arrays and is configured to receive current from the one solar power array. The current sensing element also has a sensor configured to sense a magnetic flux induced by the current from the one solar power array, and the sensor is configured to transmit data indicative of the sensed magnetic flux. The current sensing element further has a magnetic core and a conductive coil for carrying the current from the one solar power array. The magnetic core has a plurality of segments, and the conductive coil passes around at least one of the segments. In addition, the sensor is positioned within a gap between at least two of the segments.

4 Claims, 18 Drawing Sheets

| Map No. | Sensor ID | Temperature | Flux Value | Current Value |
|---|---|---|---|---|
| 1 | $ID_1$ | $T_1$ | $B_1$ | $I_1$ |
| 2 | $ID_1$ | $T_2$ | $B_2$ | $I_1$ |
| 3 | $ID_1$ | $T_3$ | $B_3$ | $I_1$ |
| 4 | $ID_1$ | $T_1$ | $B_4$ | $I_2$ |
| 5 | $ID_1$ | $T_2$ | $B_5$ | $I_2$ |
| 6 | $ID_1$ | $T_3$ | $B_6$ | $I_2$ |
| 7 | $ID_2$ | $T_1$ | $B_7$ | $I_1$ |
| 8 | $ID_2$ | $T_2$ | $B_8$ | $I_1$ |
| 9 | $ID_2$ | $T_3$ | $B_9$ | $I_1$ |
| 10 | $ID_2$ | $T_1$ | $B_{10}$ | $I_2$ |
| 11 | $ID_2$ | $T_2$ | $B_{11}$ | $I_2$ |
| 12 | $ID_2$ | $T_3$ | $B_{12}$ | $I_2$ |

*FIG. 14*

SYSTEMS AND METHODS FOR CURRENT SENSING ELEMENTS FOR USE IN APPLICATIONS ASSOCIATED WITH DIFFERENT PEAK CURRENT LEVELS

CROSS REFERENCE TO RELATED APPLICATION

This application is a continuation of and claims priority to U.S. patent application Ser. No. 12/973,523, entitled Systems and Methods for Combining Current from Solar Power Arrays" and filed on Dec. 20, 2010, which is incorporated herein by reference. U.S. patent application Ser. No. 12/973,523 claims priority to U.S. Provisional Patent Application No. 61/284,537, entitled "Systems and Methods for Combining Current from Solar Power Arrays" and filed on Dec. 18, 2009, which is incorporated herein by reference.

RELATED ART

A solar power converter converts solar energy into electrical power. Such a converter usually employs a panel of photovoltaic (PV) cells for capturing energy from sunlight and is often referred to as a "solar power panel." As the pursuit for alternative energy sources continues, the use of solar power panels is becoming more widespread.

Solar power farms have been developed in an effort to harness large amounts of solar power. Such farms have many arrays of solar power panels spread over a large area, such as tens or even hundreds of acres. Each array comprises a plurality of interconnected solar power panels that generate current from solar energy. A plurality of interconnected solar power converters shall be referred to hereafter as a "solar power array." The current from each solar power array is fed to a combiner element, sometimes referred to as a "combiner box," that combines the current from multiple solar power arrays into a single combined flow of current that represents the cumulative current from each of the solar power arrays. The combined current is then fed to an energy provider usually for a fee that is based on the amount of solar power provided. Moreover, it is generally desirable to maximize the amount of solar power that is provided from each solar power farm.

The current produced by each solar power array is often at a high voltage, such as about 1,000 Volts (V) or more, and applicable safety regulations usually require the flow of current from each solar power array to pass through a fuse before being combined with the other current flows from the other solar power arrays. In addition, it is generally desirable for the performance of each solar power array to be measured in an effort to identify operational problems. Sensing of the current flowing from each solar power array can be useful to indicate the respective performances of the solar power arrays.

There are several techniques that can be used to sense current. For example, current can be passed through a resistive element to produce a voltage drop that can be sensed by a voltmeter. Such a current sensor is referred to as an "in-line" sensor since it has an element (e.g., a resistor) within the current path. Using an in-line current sensor typically provides an accurate measurement of current, but the in-line sensor unfortunately usurps power thereby reducing the amount of the solar power ultimately provided.

Another technique for measuring current involves sensing the magnetic flux generated by the current as it is flowing through a conductive medium. A Hall effect sensor is one type of sensor that is based on magnetic flux. Such sensors are not in-line and, therefore, do not usurp power. However, such sensors are typically plagued by accuracy problems when used to measure direct current (DC) and are particularly susceptible to temperature variations. Moreover, a combiner element at a solar power farm may be located outdoors and, therefore, subject to environmental temperature fluctuations. In addition, the amount of current flowing through the combiner element, at times, can be significant thereby producing a significant amount of heat. However, the heat fluctuates depending on the amount of power being generated. Accordingly, Hall effect sensors and other types of sensors that sense current based on a measurement of magnetic flux are typically plagued with performance issues that generally prevent or at least restrict their usage in measuring the current flowing through combiner elements of solar power systems.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 14 depicts exemplary current mappings, such as are depicted by FIG. 7.

DETAILED DESCRIPTION

The present disclosure generally pertains to systems and methods for combining current from solar power arrays.

Figure 1:
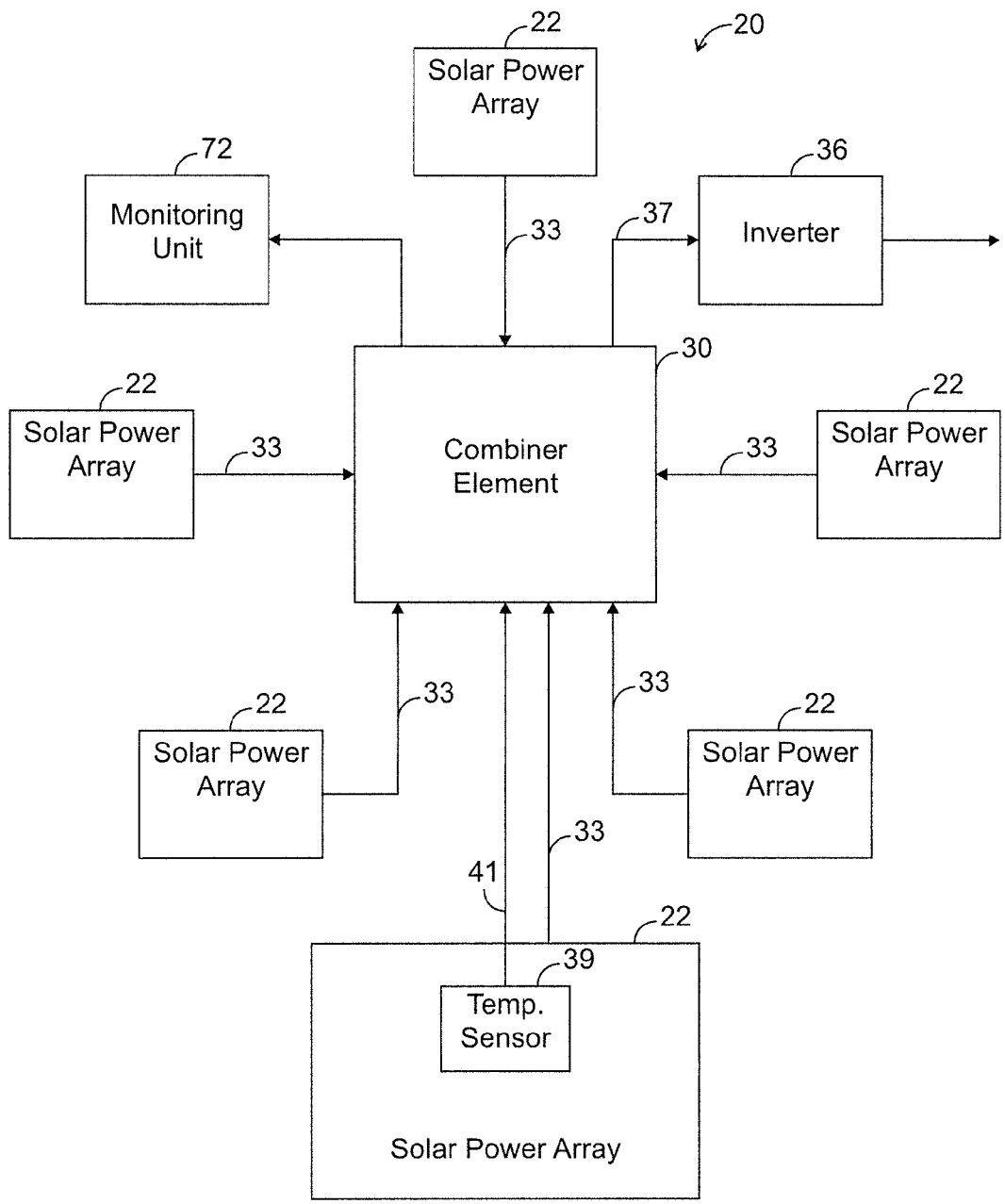
FIG. 1 is a block diagram illustrating an exemplary embodiment of a solar power system.
Figure 2:
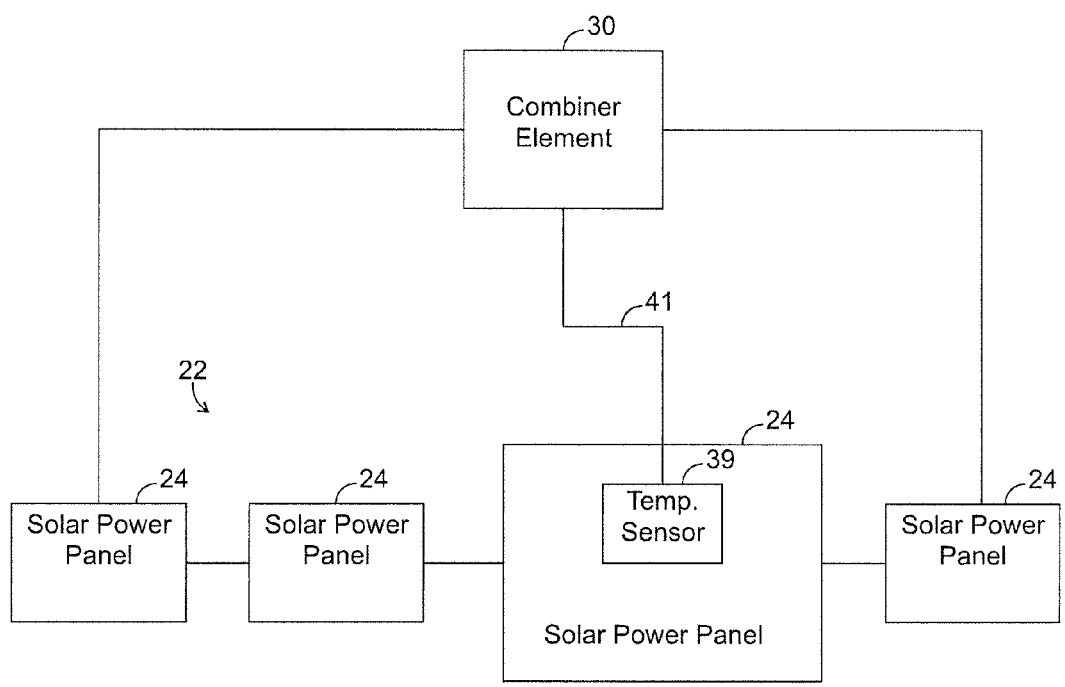
FIG. 2 is a block diagram illustrating an exemplary embodiment of a solar power array, such as is depicted by FIG. 1.

FIG. 1 depicts an exemplary embodiment of a solar power system 20 for generating and providing solar power. The system 20 comprises at least one solar power array 22, in which each array 22 comprises a plurality of solar power converters. For example, FIG. 2 shows an exemplary solar power array 22 that has a plurality of solar power panels 24 connected in series to provide a current output to the combiner element 30. Other configurations of the solar power arrays 22 are possible in other embodiments.

Referring again to FIG. 1, each solar power array 22 is coupled to a combiner element 30 that receives current from each of the solar power arrays 22. In one exemplary embodiment, the current from each solar power array 22 is direct current (DC) and is received via a respective pair of wires 33, but other numbers of wires 33 for any of the solar power arrays 22 may be used in other embodiments. Each wire 33 comprises a conductive medium that is surrounded by layer of insulation. However, other types of conductive connections may be used to conductively couple the solar power arrays 22 to the combiner element 30.

The combiner element 30 combines the current from each solar power array 22 to provide an output current that is the cumulative current from each of the solar power arrays 22. The combiner element 30 is coupled to an inverter 36 that receives the output current, which is DC, and converts the current from DC to alternating current (AC) so that the current can be applied to a power grid for commercial consumption, if desired. In one exemplary embodiment, the output current is transmitted to the inverter 36 via a pair of wires 37, but other numbers of wires 37 may be used in other embodiments. Note that the DC current from the solar power arrays 22 varies slowly over time due to fluctuations in the amount of sunlight received. For example, the current may slowly increase in the morning to a peak in the mid-afternoon as the Sun rises and then begins to decrease as the Sun falls to the horizon.

At least one of the solar panels 24 (FIG. 2) of at least one solar power array 22 is coupled to a temperature sensor 39, which senses a temperature of the panel 24. The temperature sensor 39 is coupled to the combiner element 30 and transmits data indicative of the sensed temperature to the combiner element 30. In one exemplary embodiment, the data is transmitted across a pair of wires 41, but other numbers of wires 41 may be used in other embodiments.

Figure 3:
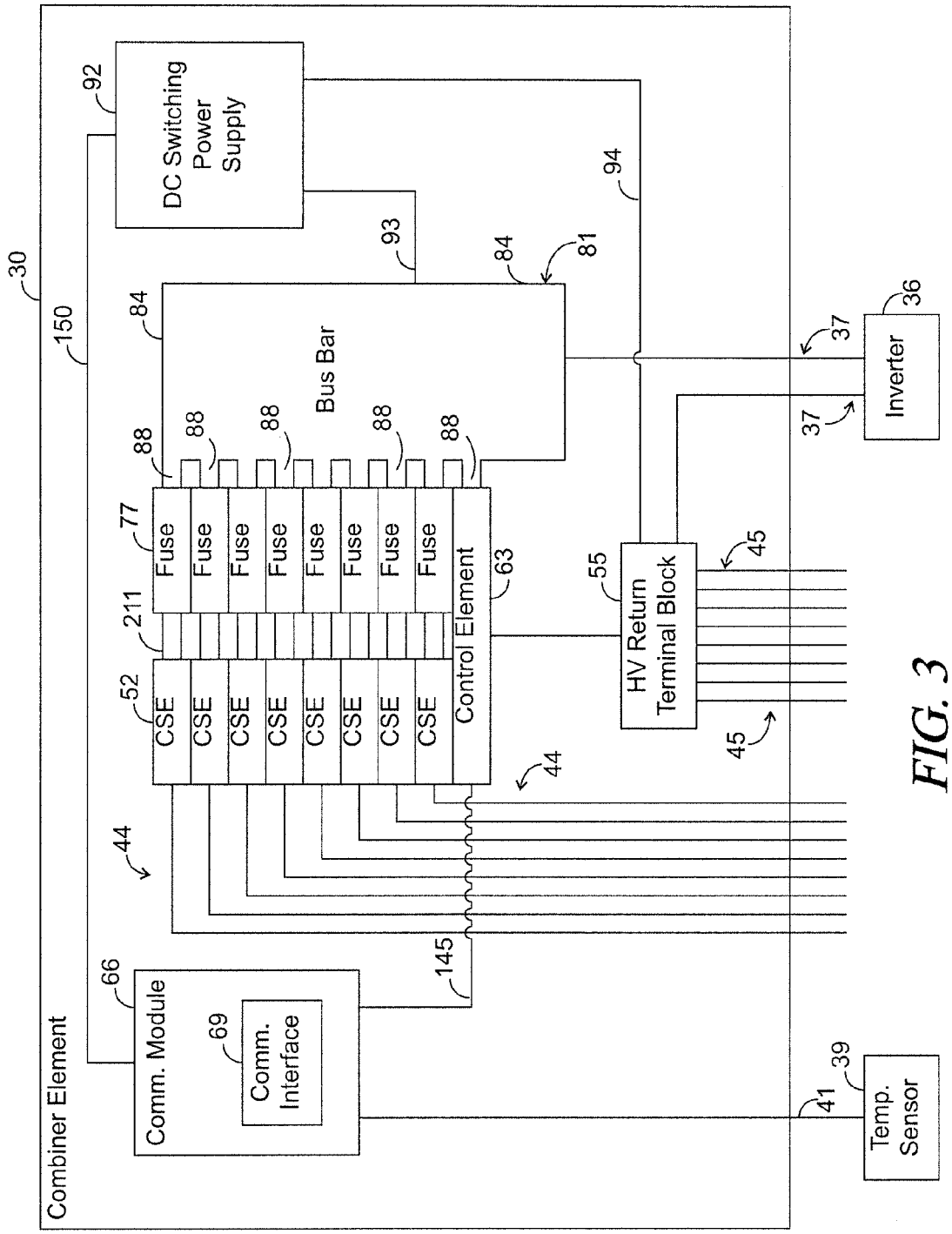
FIG. 3 is a block diagram illustrating an exemplary embodiment of a combiner element, such as is depicted by FIG. 1.

FIG. 3 depicts an exemplary embodiment of the combiner element 30. As shown by FIG. 3, the combiner element 30 comprises at least one current sensing element (CSE) 52 that is coupled to and receives current from at least one solar power array 22. In this regard, each current sensing element (CSE) 52 receives current from a respective one of the solar power arrays 22. In one exemplary embodiment, there is one current sensing element 52 for each respective solar power array 22, but other numbers of current sensing elements 52 may be used in other embodiments.

In the embodiment shown by FIG. 3, each wire 33 (FIG. 1) extending from a respective solar power array 22 has a pair of conductive media 44, 45. One such medium 44 of a given wire 33 is coupled to a respective current sensing element 52, and the other medium 45 of the same wire 33 is coupled to a high voltage (HV) return terminal block 55.

Each current sensing element 52 is coupled to and communicates with a control element 63. As will be described in more detail hereafter, each current sensing element 52 measures a parameter indicative of the current flowing through the element 52 from the respective solar power array 22 that is coupled to it, and transmits data indicative of the measured parameter to the control element 63. Based on mappings stored in the control element 63, the control element 63 compensates for inaccuracies in the measured parameters and, for each measurement, determines a current value that accurately indicates the amount of current flowing through the respective current sensing element 52 that provided the measurement. The control element 63 transmits the current values derived from the current sensing elements 52 to a communication module 66 that has a communication interface 69. The current values are transmitted from the communication interface 69 to a monitoring unit 72 (FIG. 1) that is configured to monitor data from the combiner element 30. In one exemplary embodiment, the communication interface 69 communicates with the monitoring unit 72 wirelessly, but the communication may occur over physical media in other embodiments. Commonly-assigned U.S. patent application Ser. No. 12/463,050, and entitled "Systems and Methods for Communicating Messages in Wireless Networks," which is incorporated herein by reference, describes communication techniques and systems that may be used to communicate data wirelessly, and such techniques and systems may be used for the communication between the interface 69 and the monitoring unit 72 and/or other data communications described herein, if desired. Other communication systems and methods may be used in other embodiments.

Note that it is possible for compensation of inaccuracies in the measured parameters to be remotely, such as by the monitoring unit 72. For example, data indicative of the parameters measured by the current sensing elements 52 may be transmitted to the monitoring unit 72, and the monitoring unit 72 may be configured to compensate the parameters for inaccuracies and to compensate in order to determine current values that accurately indicate the amount of current flowing through the current sensing elements 52.

The monitoring unit 72 is configured to monitor the data received from the combiner element 30 in order to evaluate the performance of the system 20. For example, if the monitoring unit 72 determines, based on the current values, that the performance of one of the solar power arrays 22 significantly lags the performance of the other arrays 22, the monitoring unit 72 may provide an alarm so that a user is alerted to such lagging performance. Various other types of monitoring may be performed in other examples.

As shown by FIG. 3, the temperature sensor 39 (FIG. 1) is coupled to the communication module 66. Data indicative of the temperature sensed by the sensor 41 is received by the communication module 66 and transmitted to the monitoring unit 72 by the communication interface 69. The monitoring unit 72 may use such data in evaluating the performance of the system 20. For example, the panel temperature measured by the sensor 39 may be compared to an ambient temperature measurement for determining when the panel temperature is significantly elevated relative to the ambient temperature. In addition, decreases in solar power output for a given temperature reading may indicate operational problems or declining performance due to system aging or other factors.

As shown by FIG. 3, each current sensing element 52 is coupled to a respective fuse 77. The current passing through and sensed by a current sensing element 52 is received by and passes through the fuse 77 that is coupled to the element 52. If the current exceeds a threshold, the fuse 77 is configured to transition to an open circuit state such that the current is prevented from flowing through the fuse 77. Once tripped to an open circuit state, the fuse 77 can be manually reset so that current may flow again through the fuse 77 provided that the current is then at and remains below the threshold. The fuse 77 helps to prevent the current from reaching unsafe levels or levels that would likely damage the components of the combiner element 30 or components coupled to it, such as the solar power arrays 22 and wiring 33.

Each fuse 77 is coupled to a conductive medium 81 that conducts the current from all of the sensing elements 52. Thus, the current carried by the conductive medium 81 is the combined current generated from solar energy by all of the solar power arrays 22 (FIG. 1). The current carried by the medium 81 is transmitted to the inverter 36 via the wires 37 (FIG. 1) and is ultimately distributed for use by consumers and/or energy service providers.

In one exemplary embodiment, the conductive medium 81 comprises a rigid, conductive structure 84, referred to as a "bus bar," composed of copper or some other conductive material. The bus bar 84 has a plurality of fingers 88 that can be used to make electrical connection with other components, such as the fuses 77 and control element 63, as will be described in more detail below.

As shown by FIG. 3, the combiner element 30 comprises a direct current (DC) switching power supply 92, which is coupled to the bus bar 84 by a conductive connection 93, such as a wire, and to the HV return terminal block 55 by a conductive connection 94, such as a wire. The DC switching power supply 92 is configured to usurp power from the bus bar 84 in order to provide, to the communication module 66, power for re-charging an optional battery within the module 66, as will be described in other embodiments. In other embodiments, other techniques for supplying power are possible. For example, a solar power panel (not shown) may be used to generate solar power for powering the electrical components of the combiner element 30 such that no power or less power is usurped from the bus bar 84.

Figure 4:
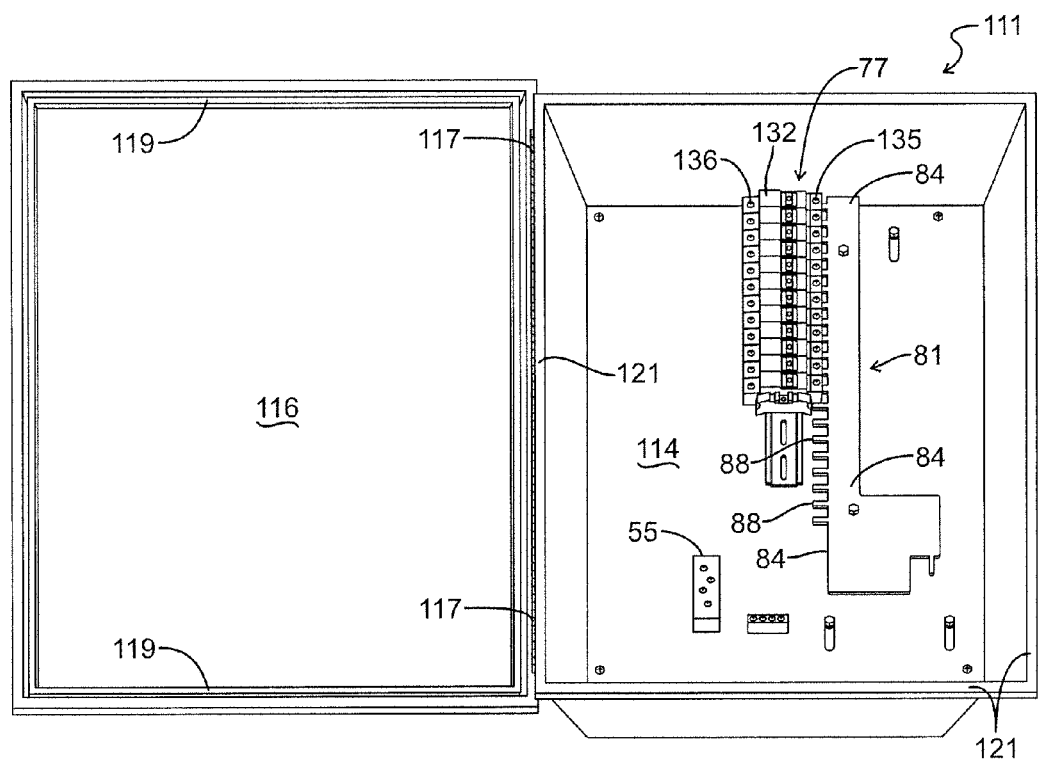
FIG. 4 depicts an exemplary embodiment of a housing for a combiner element, such as is depicted by FIG. 3.

FIG. 4 depicts an exemplary housing 111 that may be used to house the components of the combiner 30. Various components of the combiner element 30, such as the current sensing elements 52, the control element 63, and the communication module 66 are not shown by FIG. 4 for simplicity of illustration, but such components may be housed by the housing 111. The housing 111 has a base 114 and a rotatable cover 116 that is coupled to the base 114 by a hinge 117. The cover 116 may be rotated from an open position, as shown by FIG. 4, to a closed position such that the components of the combiner 30 are completely enclosed by the housing 111. When the housing 111 is in the closed position, the housing 111 is watertight so that water cannot contact any of the electrical components of the combiner element 30. In this regard, the cover 116 has a seal 119 composed of rubber or some other pliable material that makes contact with a rim 121 of the base 114 when the cover 116 is in the closed position. Various other configurations of the housing 111 are possible in other embodiments.

Each fuse 77 is housed by a fuse housing 132 (FIG. 4). Each fuse housing 132 has an opening for receiving a finger 88 of the bus bar 81. Once the finger 88 is inserted into the fuse housing 132, a coupler 135, such as a screw, is used to secure the finger 88 to the fuse housing 132 such that the finger 88 remains in electrical contact with the fuse 77 that is housed by the housing 132. In this regard, the coupler 135 generates a force that presses the finger 88 against the fuse housing 132 holding the finger 88 in place relative to the fuse housing 132.

On a side of the fuse housing 132 opposite of the side into which the finger 88 is inserted, the fuse housing 132 has an opening for receiving a conductive finger (not shown in FIG. 4) of a respective current sensing element 52, as will be described in more detail hereafter. A coupler 136, such as a screw, may be used in a manner similar to the coupler 135 in order to secure the finger of the current sensing element 52.

Figure 5:
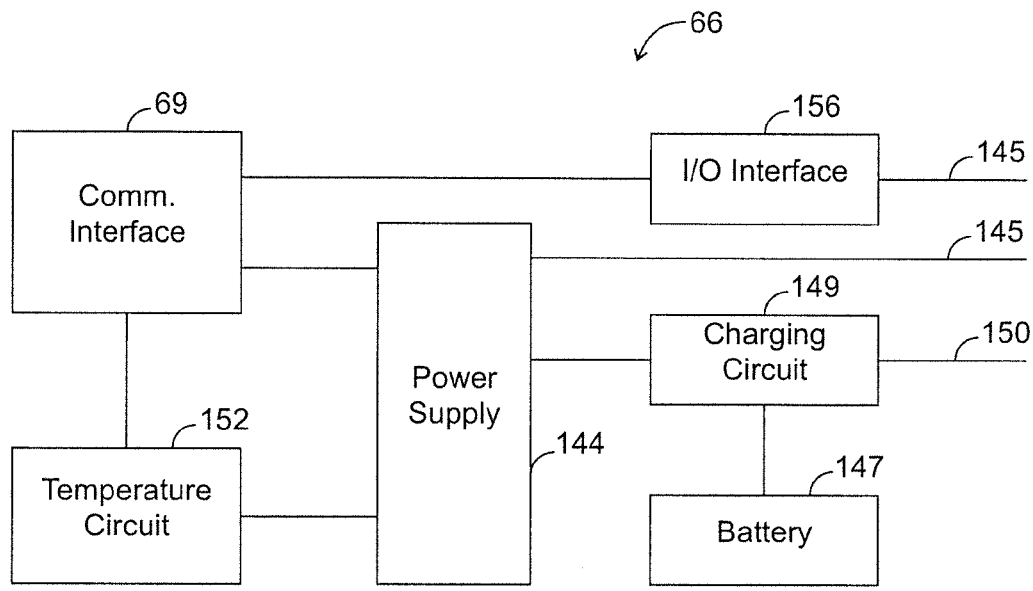
FIG. 5 is a block diagram illustrating an exemplary embodiment of a communication module, such as is depicted by FIG. 3.

FIG. 5 depicts an exemplary embodiment of the communication module 66. The communication module 66 has a power supply 144 that is coupled to the other electrical components of the module 66 and used to provide electrical power to such components as needed. The power supply 144 is also coupled to the control element 63 (FIG. 3) by a conductive connection 145 (FIG. 3), such as one or more pairs of wires, and provides electrical power to the electrical components of the control element 63. The power supply 144 is coupled to and receives electrical power from a re-chargeable battery 147, which is charged by a battery charging circuit 149. The battery charging circuit 149 is coupled to the DC switching power supply 92 by a conductive connection 150 (FIG. 3), such as one or more pairs of wires, and receives electrical power from this power supply 92 for charging the battery 147. In other embodiments, other configurations and other techniques for providing electrical power to the electrical components of the combiner element 30 are possible.

The communication module 66 also comprises a temperature circuit 152 that is coupled to and receives temperature data from the temperature sensor 39 (FIG. 1). In addition, an input/output (I/O) interface 156 is coupled to the control element 63 (FIG. 3) and receives data, such as compensated current values, from the control element 63. The data from the temperature sensor 39 and the control element 63 is provided to the communication interface 69, which transmits the data to the monitoring unit 72 (FIG. 1). Various other configurations of the communication module 66 are possible in other embodiments.

Figure 6:
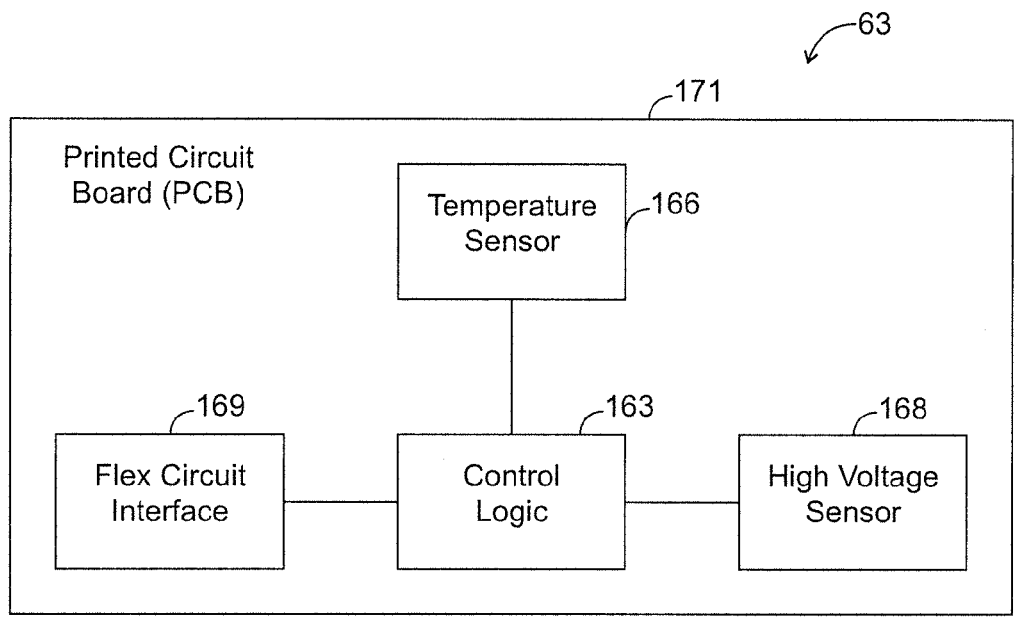
FIG. 6 is a block diagram illustrating an exemplary embodiment of a control element, such as is depicted by FIG. 3.

FIG. 6 depicts an exemplary embodiment of the control element 63. As shown by FIG. 6, the control element 63 comprises control logic 163 that controls the operation of the control element 63, as will be described in more detail hereafter. The control logic 163 is coupled to and communicates with a temperature sensor 166 and a high voltage sensor 168. The temperature sensor 166 is configured to sense a temperature and to transmit data indicative of the sensed temperature to the control logic 163. Preferably, the sensed temperature indicates the approximate temperature of the current sensing elements 52 (FIG. 3). If the control element 63 is close to the current sensing elements 52, then the temperature sensor 166 may be mounted on components (e.g., a printed circuit board) of the control element 63, but other positions of the sensor 166 are possible. As an example, the temperature sensor 166 may be mounted on a current sensing element 52.

The high voltage sensor 168 is configured to sense a voltage of the bus bar 84 (FIG. 3) and to transmit data indicative of the sensed voltage to the control logic 163. The control logic 163 is also coupled to and communicates via a flex circuit interface 169 with a flex circuit, as will be described in more detail hereafter. In one exemplary embodiment, the control logic 163, temperature sensor 166, high voltage sensor 168, and flex circuit interface 169 reside on a printed circuit board 171, as shown by FIG. 6. However, it should be emphasized that configurations other than the one shown by FIG. 6 are possible in other embodiments.

In addition, it should be noted that the control logic 163 can be implemented in hardware, software, firmware, or any combination thereof. In an exemplary embodiment illustrated in FIG. 7, the control logic 163 is implemented in software and stored in memory 175 of an instruction execution device 176. As an example, the control logic 163 may be stored in and executed by a microprocessor.

Note that the control logic 163, when implemented in software or firmware, can be stored and transported on any computer-readable medium for use by or in connection with an instruction execution device that can fetch and execute instructions. In the context of this document, a "computer-readable medium" can be any means that can contain or store a program for use by or in connection with an instruction execution device.

Figure 7:
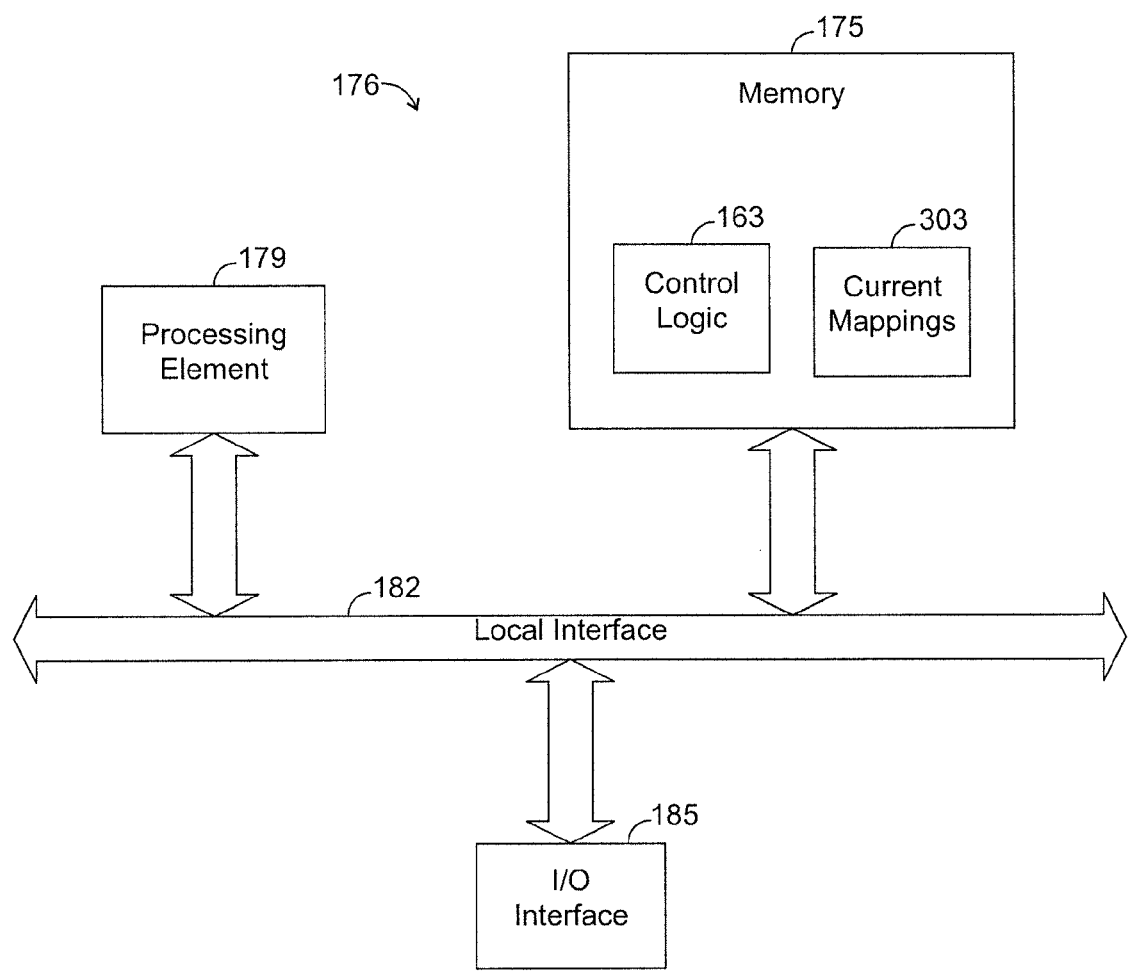
FIG. 7 is a block diagram illustrating an exemplary embodiment of an instruction execution device containing control logic, such as is depicted by FIG. 6.

The exemplary embodiment of the instruction execution device 176 depicted by FIG. 7 comprises at least one conventional processing element 179, such as a central processing unit (CPU), that communicates to and drives the other elements within the device 176 via a local interface 182, which can include at least one bus. Furthermore, an input/output (I/O) interface 185 allows the device 176 to exchange data with other components. For example, in one exemplary embodiment, the I/O interface 185 is coupled to the temperature sensor 166, the high voltage sensor 168, and the flex circuit interface 169 of FIG. 7.

Figure 8:
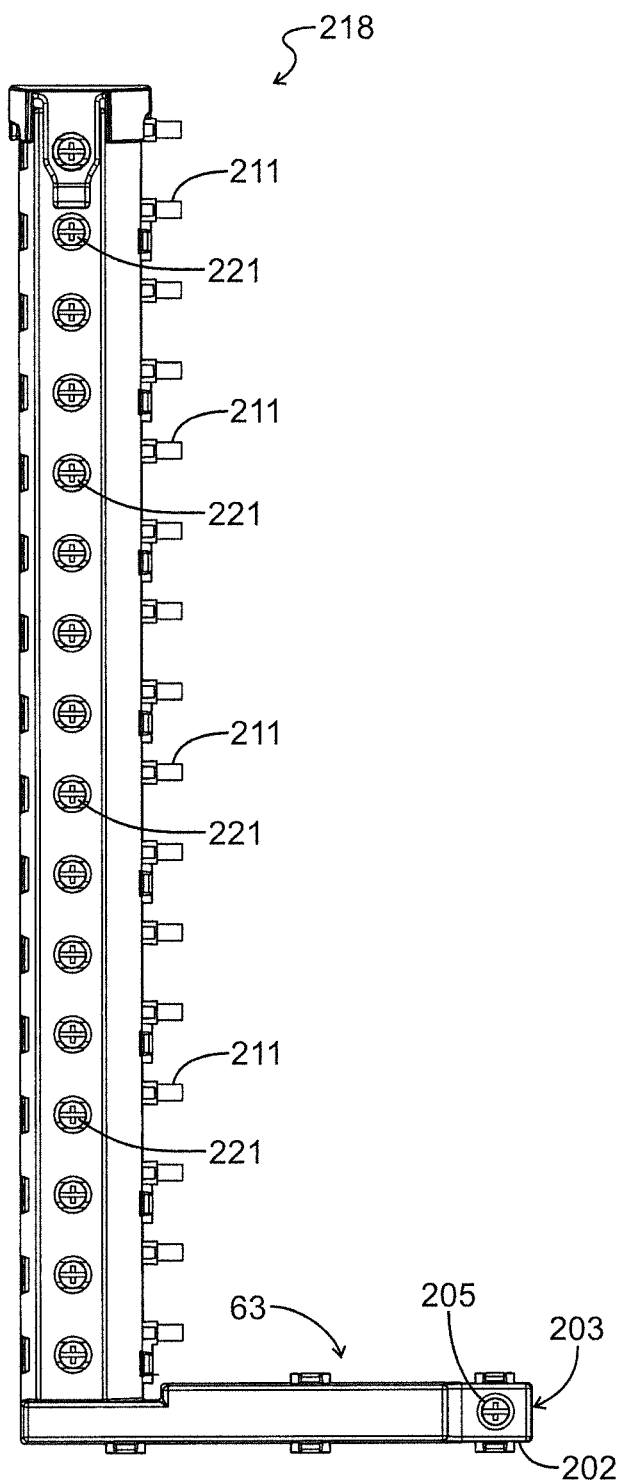
FIG. 8 is a top view illustrating an exemplary embodiment of a housing for current sensing elements.

FIG. 8 is a top view illustrating an exemplary housing 218 that is used to house the current sensing elements 52. As shown by FIG. 8, each current sensing element 52 has a conductive finger 211 extending from the element 52. In one exemplary embodiment, each finger 211 is a rigid structure, like the fingers 88 of the bus bar 84. Further, each finger 211 passes through a hole in a fuse housing 132 (FIG. 4) for a respective fuse 77 and is secured to the fuse housing 132 by a coupler 136 such that the finger 211 remains in electrical contact with the fuse 77 that is housed by the fuse housing 132. In this regard, the coupler 136 generates a force that presses the finger 211 against the fuse housing 132 holding the finger 211 in place relative to the fuse housing 132.

Figure 9:
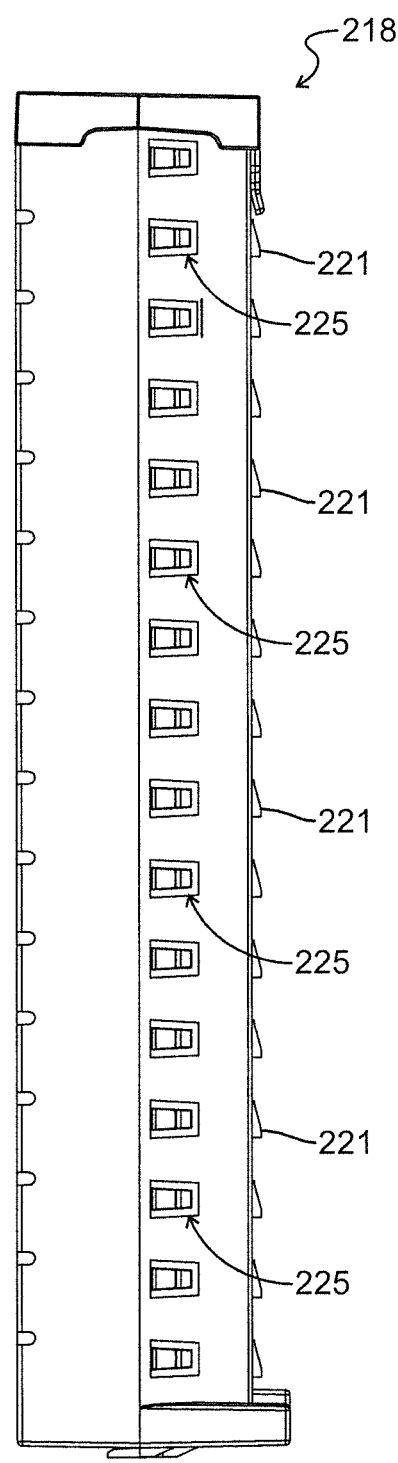
FIG. 9 is a side view illustrating the housing of FIG. 8.

For each current sensing element 52, the housing 218 has a hole through which a coupler 221, such as a screw, passes. For each current sensing element 52, the housing 218 has another hole 225 for receiving the conductive medium 44 carrying current from a respective solar power array 22, as shown by FIG. 9. Such hole 225 is on a side of the housing 221 opposite of the finger 211, which is conductively coupled to the conductive medium 44 through the current sensing element 52.

The control element 63 has a housing 202, which has a hole 203 for receiving a finger 88 (FIG. 4) of the bus bar 84. Once the finger 88 is inserted into the housing 202, a coupler 205, such as a screw, is used to secure the finger 88 to the housing 202 such that the finger 88 remains in electrical contact with the high voltage sensor 168 that is housed by the housing 202. In this regard, the coupler 205 generates a force that presses the finger 88 against components of the control element 63 holding the finger 88 in place relative to the control element 63.

Figure 10:
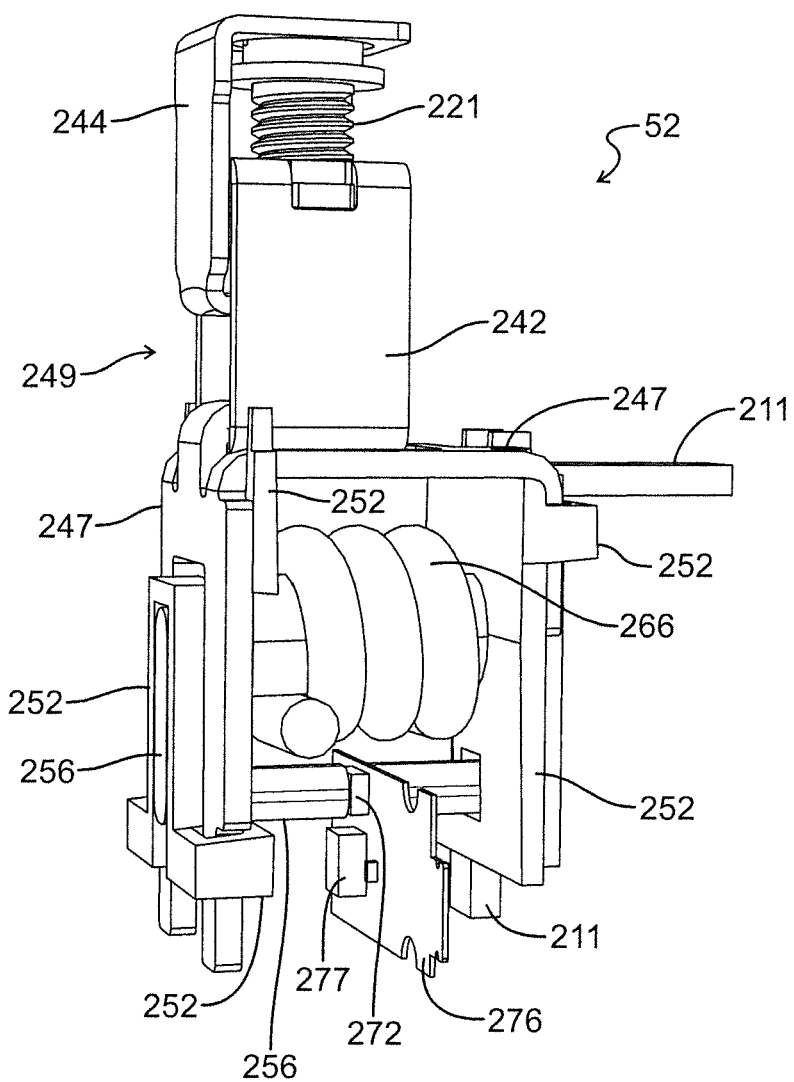
FIG. 10 depicts an exemplary embodiment of a current sensing element, such as is depicted by FIG. 3.
Figure 11:
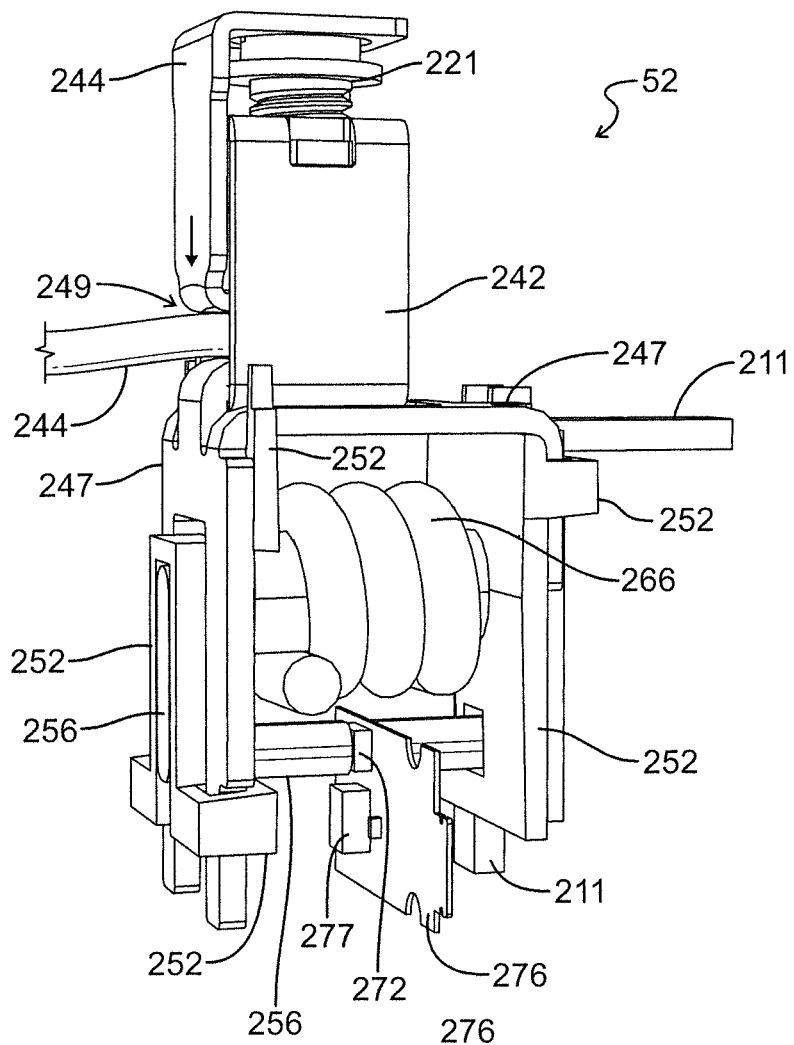
FIG. 11 depicts the current sensing element of FIG. 10 after a conductive medium has been secured to the current sensing element.

FIG. 10 depicts an exemplary embodiment of a current sensing element 52. The element 52 has a screw block 242 into which the coupler 221 is screwed or otherwise inserted. The coupler 221 has a head that contacts and presses against a tab 244. The screw block 242 rests on a conductive tab 247. A conductive medium 44 (not shown in FIG. 10) is inserted into a gap 249 between the tabs 244, 247, and the coupler 221 is screwed down so that the tab 244 presses against the conductive medium 44, which is sandwiched between the tabs 244, 247, as shown by FIG. 11. The force exerted on the conductive medium 44 by the tab 244 holds the conductive medium 44 in place and ensures an electrical coupling between the conductive medium 44 and the conductive tab 247.

Figure 12:
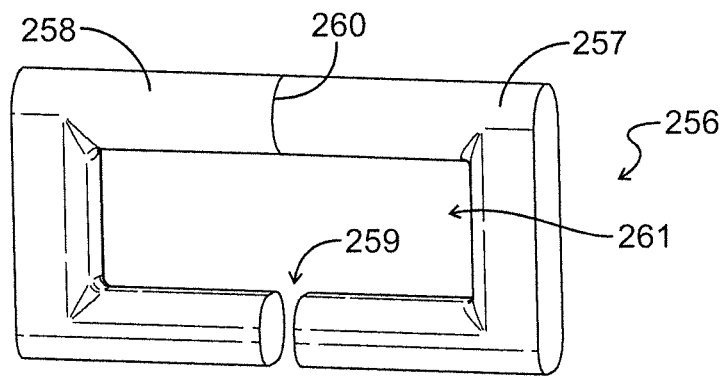
FIG. 12 depicts a magnetic core in the current sensing element depicted by FIG. 10.

The components of the element 52, such as the tab 247, are supported by a bobbin 252, which is composed of electrically insulating material. A magnetic core 256 is held by the bobbin 252. In one exemplary embodiment, as shown by FIG. 12, the magnetic core 256 is composed of ferrite material and is generally in the shape of a rectangular bar having a hollow region 261 within the legs of the bar. In addition, the magnetic core 256 has a small gap 259 in one of its legs. In one exemplary embodiment, the magnetic core 256 comprises a plurality of core segments that have been positioned to form the magnetic core 256 shown. For example, in FIG. 12, the core 256 comprises two core segments 257, 258 that are positioned such that the end of one segment 257 abuts the end of the other segment 258 at point 260. The segments 257, 258 are held in place by the bobbin 252. For example, the segments 257, 258 may be spring-loaded such that the force of one or more springs pushes the segments 257, 258 together.

Conductive coils 266 are wound around the bobbin 252, as shown by FIG. 10. One end of the coils 266 is electrically coupled to the conductive tab 247, and the opposite end of the coils 266 is electrically coupled to the finger 211. For example, one end of the coils 266 may be resistively soldered to the conductive tab 247, and the other end of the coils 266 may be resistively soldered to the finger 211. Thus, the current from the conductive medium 44 inserted into the gap 249 flows through the conductive tab 247 to the coils 266. Such current also flows through the coils 266 to the finger 211 and on to the fuse 77 (FIG. 3) and bus bar 84. In the exemplary embodiment shown by FIG. 10, the finger 211 is L-shaped, but other shapes for the finger 211 are possible in other embodiments.

In addition, the magnetic core 256 passes through the coils 266. In this regard, the portion of the bobbin 252 on which the coils 266 are wound is hollow, and the core 256 passes through this hollow region. The current flowing through the coils 266 induces a magnetic flux that is concentrated in and flows through the magnetic core 256.

In addition, a magnetic flux sensor 272 is positioned within the gap 259 of the magnetic core 256. The flux sensor 272 is configured to sense the magnetic flux flowing through the core 266, and this flux is indicative of the current flowing through the coils 263. In particular, the flux varies proportionally with the current. In one exemplary embodiment, the sensor 272 is a Hall effect sensor, but other types of sensors may be used in other embodiments.

In one exemplary embodiment, the flux sensor 272 resides on a portion of a flex circuit 276 that is interfaced with the flex circuit interface 169 (FIG. 6) of the control element 63. Also residing on the flex circuit 276 is a sensor control element 277 that selectively enables the sensor 272, as will be described in more detail hereafter.

Mounting the sensor 272 on a flex circuit 276 helps to minimize the size of the gap 259 in which the sensor 272 is positioned. In this regard, a printed circuit board (PCB), rather than a flex circuit 276, could be used for mounting the sensor 272. However, a typical PCB has a thickness greater than that for the flex circuit 276. In one exemplary embodiment using the flex circuit 276, the width of the gap 259 is about 50 thousandths of an inch. In another embodiment using a PCB, the width of the gap 259 is about 100 thousandths of an inch. Decreasing the width of the gap 259 generally improves the sensitivity and correspondingly the accuracy of the sensor 272 by increasing the signal-to-noise (SNR) ratio.

Figure 21:
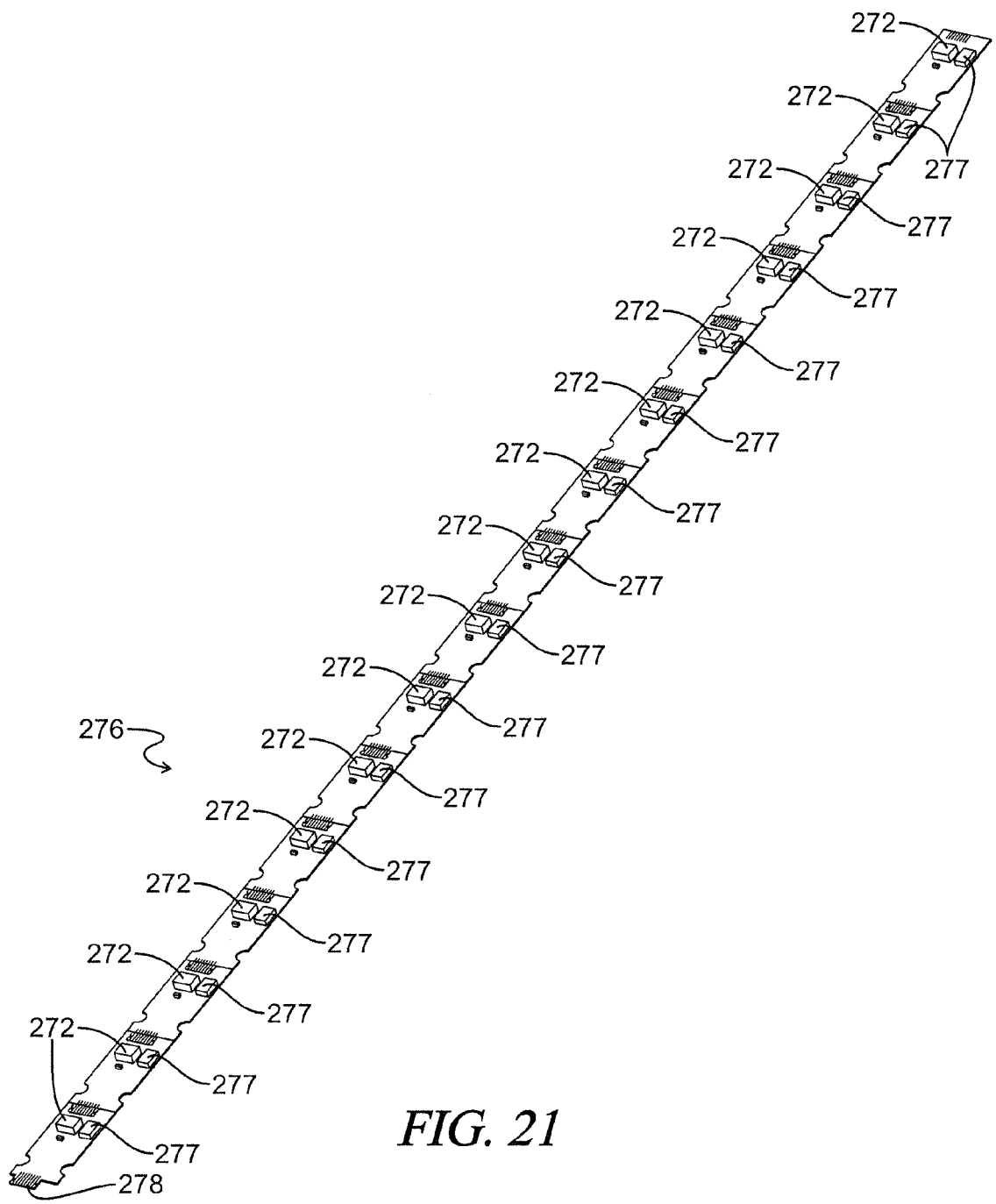
FIG. 21 depicts an exemplary embodiment of a flex circuit.

Note that FIG. 10 shows only a portion of the flex circuit 276. In actuality, the flex circuit 276 extends from the flex circuit interface 169 (FIG. 6) of the control element 63 through each current sensing element 52 such that the flex circuit 276 forms an elongated strip of material that spans the entire length of the current sensing elements 52. FIG. 21 shows an exemplary flex circuit 276 that can be used for the exemplary embodiment shown by FIG. 3. As shown by FIG. 21, the flex circuit 276 has an end 278 that can be plugged into or otherwise interfaced with the flex circuit interface 169 (FIG. 6) of the control element 63. The flex circuit 276 extends from this interface 169, and the flux sensors 272 and the current sensing elements 52 are appropriately positioned such that each sensor 272 is positioned within the gap 259 (FIG. 12) of a respective one of the current sensing elements 52.

Once the components of the current sensing elements 52 have been positioned, as described herein, a potting material may be poured into the housing 218 of the current sensing elements 52 to cover the flex circuit 276 and at least a portion of the magnetic core 256. In one exemplary embodiment, the potting material covers the bottom portion of the core 256 and the flex sensors 272 such that when the potting material hardens, it holds the sensors 272 in place relative to the core 256. Using potting material in such a manner generally helps to improve the accuracy of the sensor readings.

Figure 13:
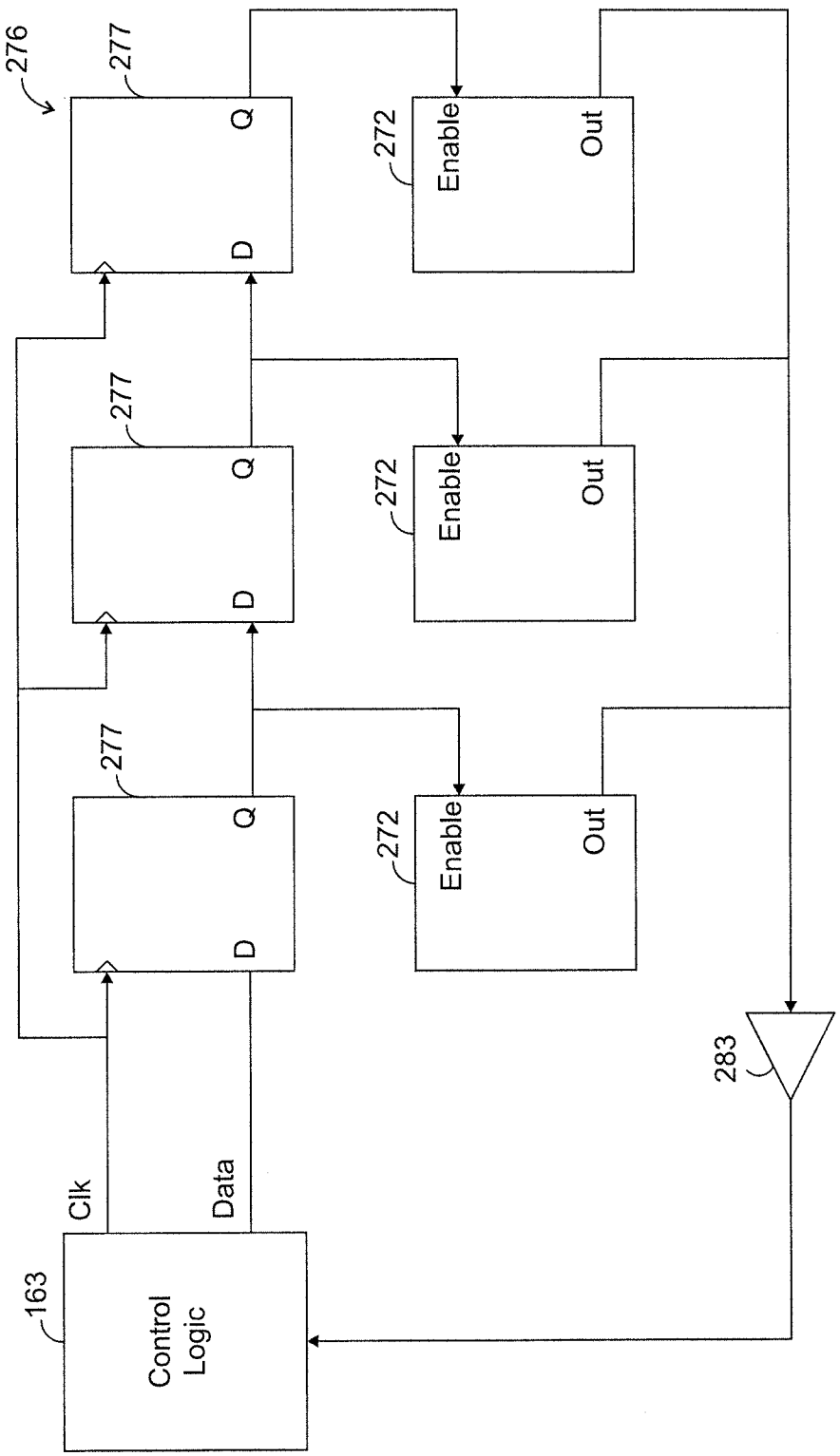
FIG. 13 is a block diagram illustrating an exemplary circuit of sensor control elements and flux sensors for current sensing elements, such as are depicted by FIG. 3.

FIG. 13 depicts an exemplary circuit diagram for the flex circuit 276. In this regard, the flex circuit 276 carries signals to and from the control logic 163 of the control element 63 (FIG. 6). In the exemplary embodiment shown by FIG. 13, each sensor control element 277 is implemented as a flip-flop, but other configurations of the sensor control elements 277, as well as the overall flex circuit 276, are possible in other embodiments. Further, for simplicity, FIG. 13 shows the control circuitry for the flux sensors 272 of three current sensing elements 52. A similar arrangement may be used to control any number of sensors 272 for any number of current sensing elements 52.

The control logic 163 transmits a clock signal ("clk") and a digital data signal ("data"). For the data signal, the control logic 163 transmits a logical "1" followed by sufficient number of a logical "0" so that only one of the sensor control elements 277 is storing a logical "1" at the same time. Thus, a logical "1" is shifted from element-to-element, and the element 277 that is storing the logical "1" enables its corresponding sensor 272 (i.e., the sensor 272 coupled to its output, Q). Therefore, only one sensor 272 is enabled at a time. As the logical "1" is shifted to a new sensor control element 277, a new sensor 272 is enabled. The output of the enabled sensor 272 is amplified by an operational amplifier 283 before being received by the control logic 163. In other embodiments, the output of the enabled sensor 272 may be amplified by other types of circuit components, and it is possible that such output may not need amplification. The output from the enabled sensor 272 is a value indicative of the magnetic flux measured by such sensor 272.

Accordingly, to take a reading of each sensor 272, the control logic 163 successively clocks a logical "1" through each of the sensor control elements 277 so that each of the sensors 272 is successively enabled during a different clock cycle. For each clock cycle, the control logic 163 stores the value received from the operational amplifier 283. After the logical "1" has propagated through each of the sensor control elements 277, the control logic 163 has stored a measurement value from each sensor 272. Such measurement value is indicative of the magnetic flux measured by the enabled sensor 272 that produced the measurement value.

It should be noted that the amount of current passing through a current sensing element 52 can be drastically different for different applications. For example, in one application, a solar power array 22 may be configured to produce a small peak current, such as about 1 or 2 Amperes (A). However, in another application, a solar power array 22 may be configured to produce a much higher peak current, such as 20 A or greater. Such a variance in potential applications makes the design of the circuitry for measuring current problematic.

For example, if the electrical components are designed specifically for small currents, then the components may saturate if the combiner element 30 is used in an application that produces currents that are larger than expected. If the electrical components are designed specifically for large currents, then resolution may be needlessly degraded if the combiner element 30 is used in an application that produces current smaller than expected.

The use of the coils 266 provides a convenient way to control the flux passing through the core 256 and measured by the sensor 272 so that the electrical components for sensing current can operate more efficiently without saturating. In this regard, the coils 266 have a number (N) of turns. The flux concentrated in the core 256 for a given current passing through the coils 266 varies proportionally to N. That is, for a larger N, a greater amount of flux is concentrated in the core 256 for a given current, and for a smaller N, a smaller amount of flux is concentrated in the core 256 for a given current.

Thus, N can be selected based on the anticipated level of peak current without changing the configuration of the electrical components that measure the current. In particular, by appropriately selecting N, the same flex circuit design can be used for different combiner elements 30 even though the peak currents expected for one combiner element 30 may be significantly different than the peak currents expected for another combiner element 30. Accordingly, a manufacturer may manufacture combiner elements 30 using the same flex circuit and control element configurations and simply select current sensing elements 52 having the desired number of coil turns for an expected application.

In this regard, when selecting a current sensing element 52, a determination is made as to the peak current that is expected to flow through the current sensing element 52. The manufacturer then selects a current sensing element 52 having the maximum number of coil turns, N, without saturating the electrical components of the flex circuit 276 and the control element 63 when current equal to the expected peak current is flowing through the current sensing element 52. Note that different current sensing elements 52 within the combiner element 30 may have different numbers of coil turns as different solar power arrays 22 within the same system 20 may produce different peak currents. In addition, if desired, a number of coil turns, N, less than the maximum number allowable without saturation may be selected, but using a smaller number of turns than necessary generally reduces resolution.

Rather than selecting current sensing elements 52 based on expected peak currents, the manufacturer may simply produce combiner elements 30 having current sensing elements 52 with different numbers of coil turns, and the users of the combiner elements 30 may take steps to ensure that the peak currents are appropriately limited to prevent saturation of electrical components, as may be desired. In any event, the use of coils 266 provides an ability to select the number of coil turns, N, of each respective current sensing element 52 so that the electrical characteristics of the current sensing elements 52 and the control element 63 are optimally controlled or at least controlled differently without having to change the circuitry of the flex circuit 276 and the control element 63.

In one exemplary embodiment, the sensing of current is based on current mappings 303 that are stored in the control element 63, as shown by FIG. 7. The current mappings 303 map, based on temperatures sensed by the temperature sensor 166, readings of the flux sensors 272 into current values that are indicative of the current that generated the flux measured by the sensors 272. In this regard, for each reading from a flux sensor 272 of a current sensing element 52, the control logic 163 finds a mapping 303 corresponding to the current temperature value provided by the temperature sensor 166 and the flux value provided by the flux sensor 272. Such mapping maps the flux value to a particular current value that is indicative of the current flowing through the coils 266 of the current sensing element 52. The control logic 163 then uses this current value to represent the current sensed by the current sensing element 52. For example, the control logic 163 may transmit such current value to the communication module 66.

The mappings 303 are preferably defined such that the mapping performed by the control logic 163 compensates for temperature variations. In addition, the mapping performed by the control logic 163 accounts for the number of turns, N, of the coils 266 in the particular current sensing element 52 that provided the flux value. In this regard, as described above, the number of turns, N, of the coils 266 for each current sensing element 52 may be different. Further, the number of turns, N, selected for a given current sensing element 52 affects the flux value provided by the element 52 for a given current. Each current sensing element 52 has a set of mappings 303 that are uniquely tailored to the characteristics of the respective element 52 such that variations from element 52 to element 52 (e.g., the number of turns, N) can be accommodated to provide highly accurate current values for each element 52.

There are various types of mappings 303 and techniques for defining the mappings 303 that can be employed. In one exemplary embodiment, the mappings 303 are predefined. In this regard, the mappings 303 for each current sensing element 52 are generated by testing the current sensing element 52 at known currents and known temperatures. For example, to generate a mapping 303 for a current sensing element 52, the current sensing element 52 is fed a known current (I) while it is operating at a known temperature (T). The flux value provided by the element's flux sensor 272 is then determined, and a mapping 303 corresponding to T, I, and the measured flux value is defined. A current value, $I_x$, indicative of the known current, I, is used as the mapping's current value. Thus, when the flux sensor 272, during operation, measures the flux value of this mapping 303 while receiving the same current, I, at the same temperature, T, the logic 163 maps the flux value to the foregoing current value, $I_x$.

FIG. 14 depicts a plurality of mappings 303 that may be provided according to the exemplary techniques described above. In this regard, each mapping 303 is correlated with a particular current sensing element 52 and has an identifier, referred to as "sensor identifier," that is unique to the element 52. Each mapping 303 also has a temperature value, flux value, and a current value and is defined during a testing mode that precedes the normal operation of the combiner element 30. The current value is indicative of the current that was passing through the coils 266 of the current sensing element 52 identified by the sensor identifier when the flux sensor 272 of the identified current sensing element 52 measured the flux value at the temperature indicated by the temperature value during the testing mode. Thus, when the mapping 303 is mapped to a flux value received by the logic 163 during the operation mode, the mapping provides a current value that accurately indicates the amount of current that is presently flowing through the coils 266 of the identified current sensing element 52. Such current value has been calibrated, via the testing process, for the present temperature and the number of turns, N, of the coils 266 in the identified sensing element 52. Note that if mapping inputs, such as the flux value and temperature, do not exactly match the parameters of any of the mappings 303, then the control logic 163 may be configured to interpolate between multiple mappings 303 in order to determine the appropriate current value.

The exemplary mappings 303 shown by FIG. 14, for simplicity of illustration, show the mappings 303 for two different current sensing elements 52, three temperatures ($T_1$, $T_2$, and $T_3$), and flux values ($B_1$-$B_{12}$). It should be emphasized that the mappings 303 can be defined for any number of current sensing elements 52, temperatures, and flux values. An exemplary use the mappings 303 will now be described below.

In this regard, assume that, during operation at a temperature $T_1$, the flux sensor 272 of a current sensing element 52 identified by $ID_1$ measures a flux value equal to $B_1$ and the flux sensor 272 of a current sensing element 52 identified by $ID_2$ measures a flux value, $B_{13}$, that is halfway between $B_7$ and $B_{10}$. To map $B_1$ and $B_{13}$ to current values, the control logic 163 determines a value indicative of the current temperature via the temperature sensor 166. For the flux value received from the current sensing element 52 identified by $ID_1$, the control logic 163 uses $ID_1$, the measured flux value ($B_1$), and the sensed temperature value ($T_1$) to find the mapping 303 correlated with such values. In the instant example, such mapping 303 has the current value $I_1$. The control logic 163 retrieves the current value $I_1$ from the identified mapping 303 and uses this retrieved value as the current value for the current sensed by the identified current sensing element 52. Thus, the control logic maps the flux value $B_1$ into the current value $I_1$ thereby compensating the current measurement for at least temperature and the number of turns, N, of the coils 266 in the current sensing element 52 that provided the flux value $B_1$. In one exemplary embodiment, the control logic 163 transmits the mapped current value $I_1$ to the communication module 66, which then transmits the mapped current value $I_1$ to the monitoring unit 72. In other embodiments, other uses of the mapped current value are possible.

The control logic 163 similarly maps the flux value $B_{13}$ provided by current sensing element 52 identified by $ID_2$. However, the flux value $B_{13}$ does not exactly match any of the flux values in the exemplary mappings 303 shown by FIG. 14. In such case, the control logic 163 finds the appropriate current value via interpolation. For example, the control logic 163 may identify the two mappings 303 that most closely matching the parameters for the current reading (i.e., $T_1$, $ID_2$, and $B_{13}$). In the current example, the two most closely matching mappings 303 have current values of $I_1$ and $I_2$. The control logic 163 may then determine the current value to be mapped to the flux value $B_{13}$ by interpolating between current values, $I_1$ and $I_2$, of the identified mappings 303. For example, since $B_{13}$ is halfway between $B_7$ and $B_{10}$ in the current example, the control logic 163 may map $B_{13}$ to a current value, $I_{13}$, equal to the following equation: $I_{13}=(I_1+I_2)/2$. In other embodiments and other examples, other types of interpolation techniques may be employed.

In one exemplary embodiment, portions of the control logic 163 are implemented by the monitoring unit 72. In particular, the control element 63 is configured to transmit data indicative of the readings by the sensors 272 to the monitoring unit 72 via the communication module 66. The control element 63 is also configured to transmit current mappings 303 to the monitoring unit 72 via the communication module 66, or the current mappings 303 may be otherwise stored in the monitoring unit 72. In such an embodiment, the monitoring unit 72 is configured to map the sensor readings to accurate current values according to the exemplary techniques described above. Such an embodiment, allocates the mapping processing burden to the monitoring unit 72 possibly enabling lower cost processing circuitry in the combiner element 30.

As described above and shown by FIG. 6, the control element 63 has a high voltage sensor 168 for measuring a voltage of the bus bar 84. In one exemplary embodiment, the high voltage sensor 168 comprises a voltage dividing circuit for sensing the voltage of the bus bar 84. Considering the high voltage that may be present on the bus bar 84, such as about 1000 V or more, the voltage dividing circuit preferably has multiple resistors in series and parallel so that the voltage drop across any resistor is small enough to ensure that arcing is prevented.

Figure 15:
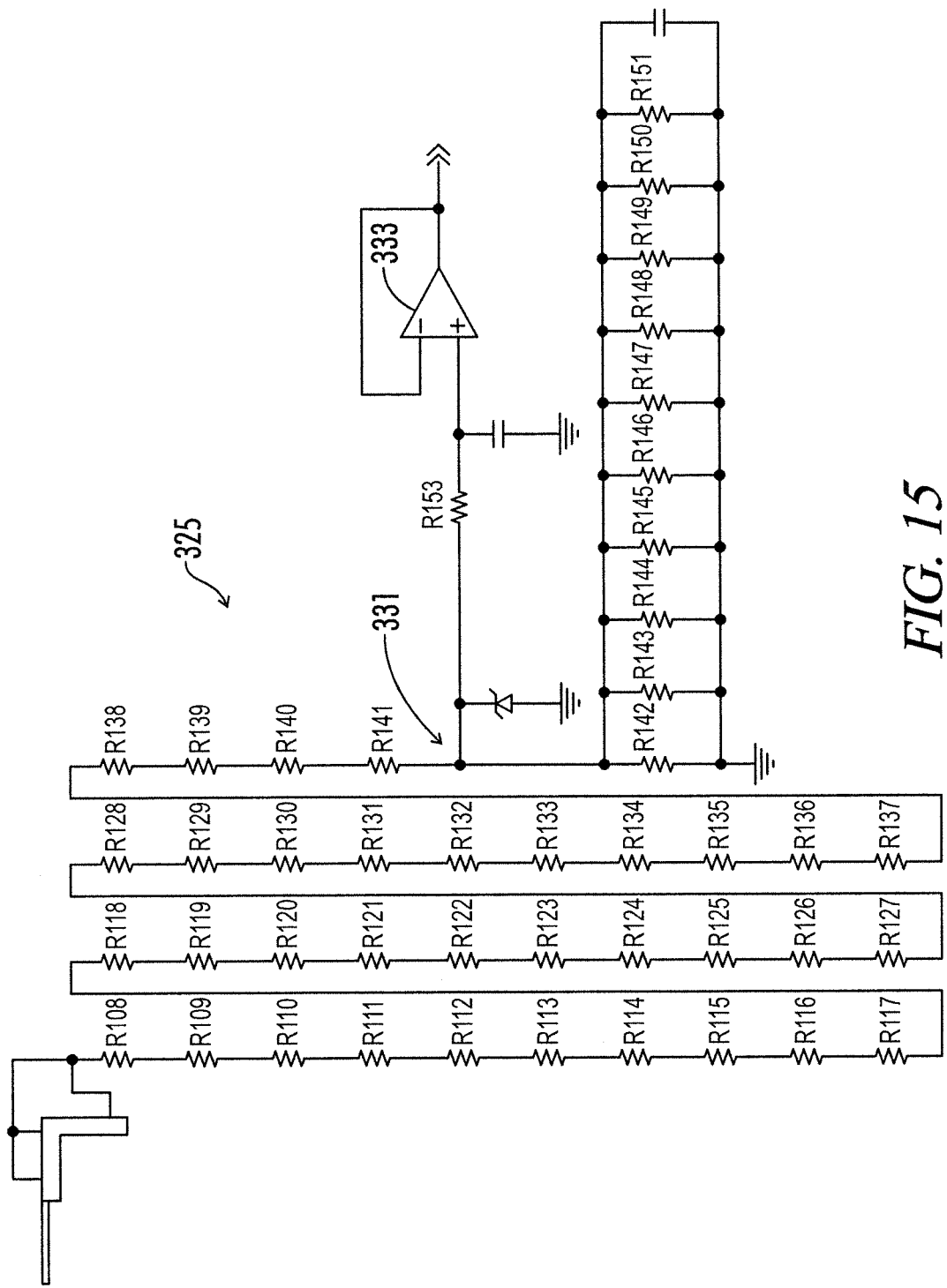
FIG. 15 depicts an exemplary circuit for a high voltage sensor, such as is depicted by FIG. 6.
Figure 16:
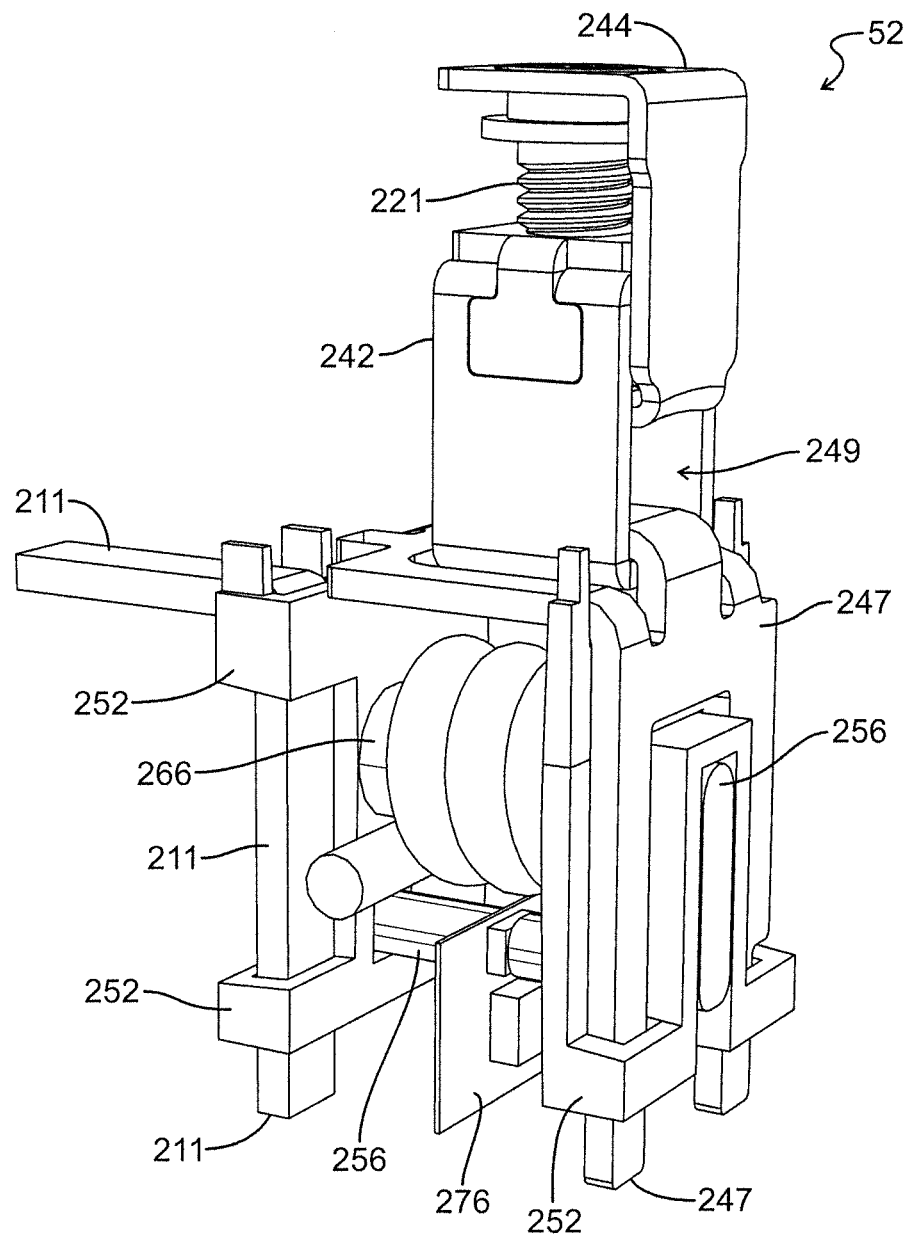
FIG. 16 depicts the current sensing element of FIG. 10.
Figure 17:
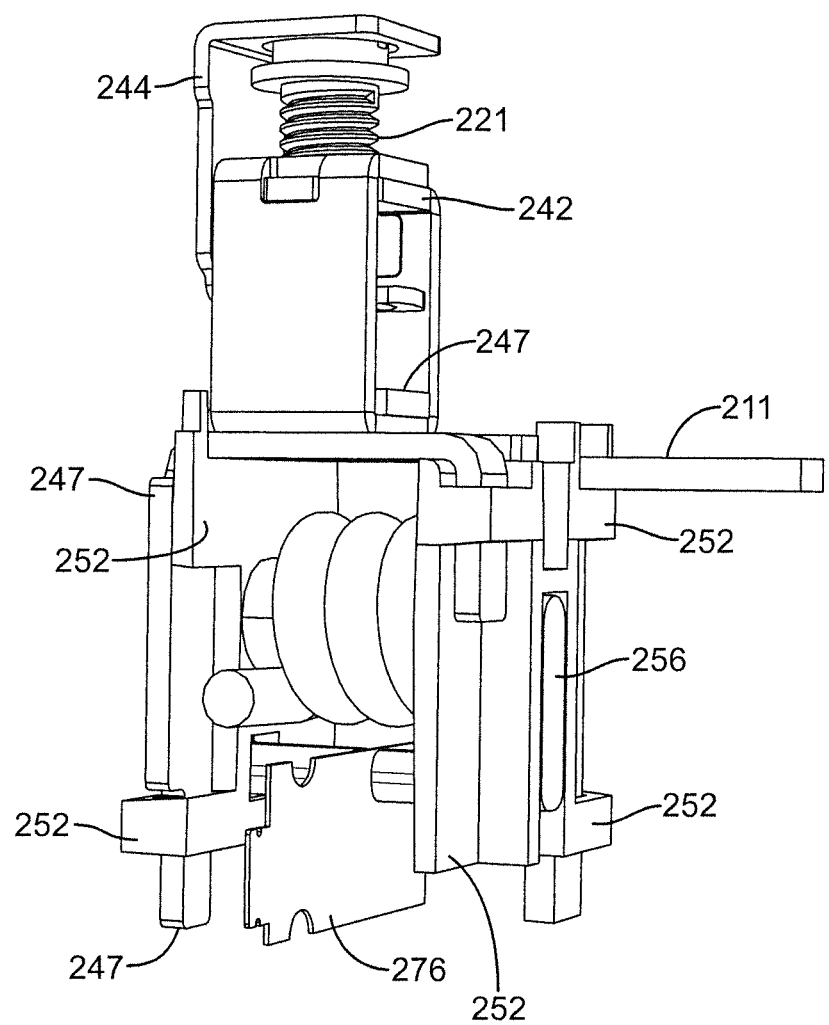
FIG. 17 depicts the current sensing element of FIG. 10.
Figure 18:
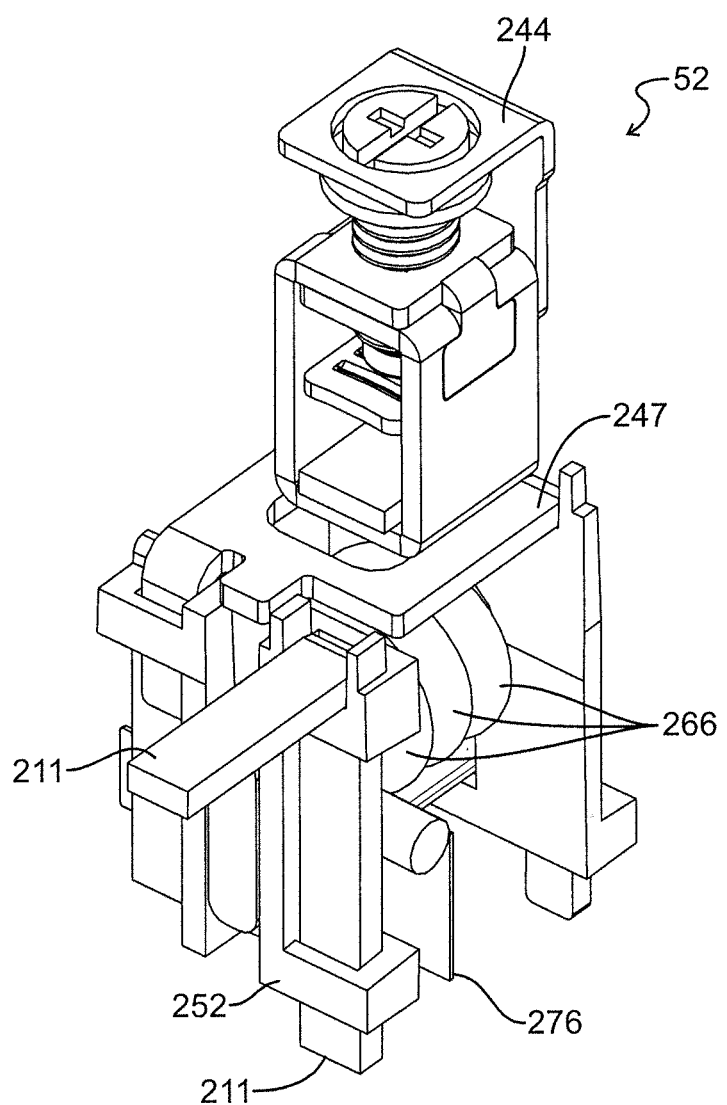
FIG. 18 depicts the current sensing element of FIG. 10.
Figure 19:
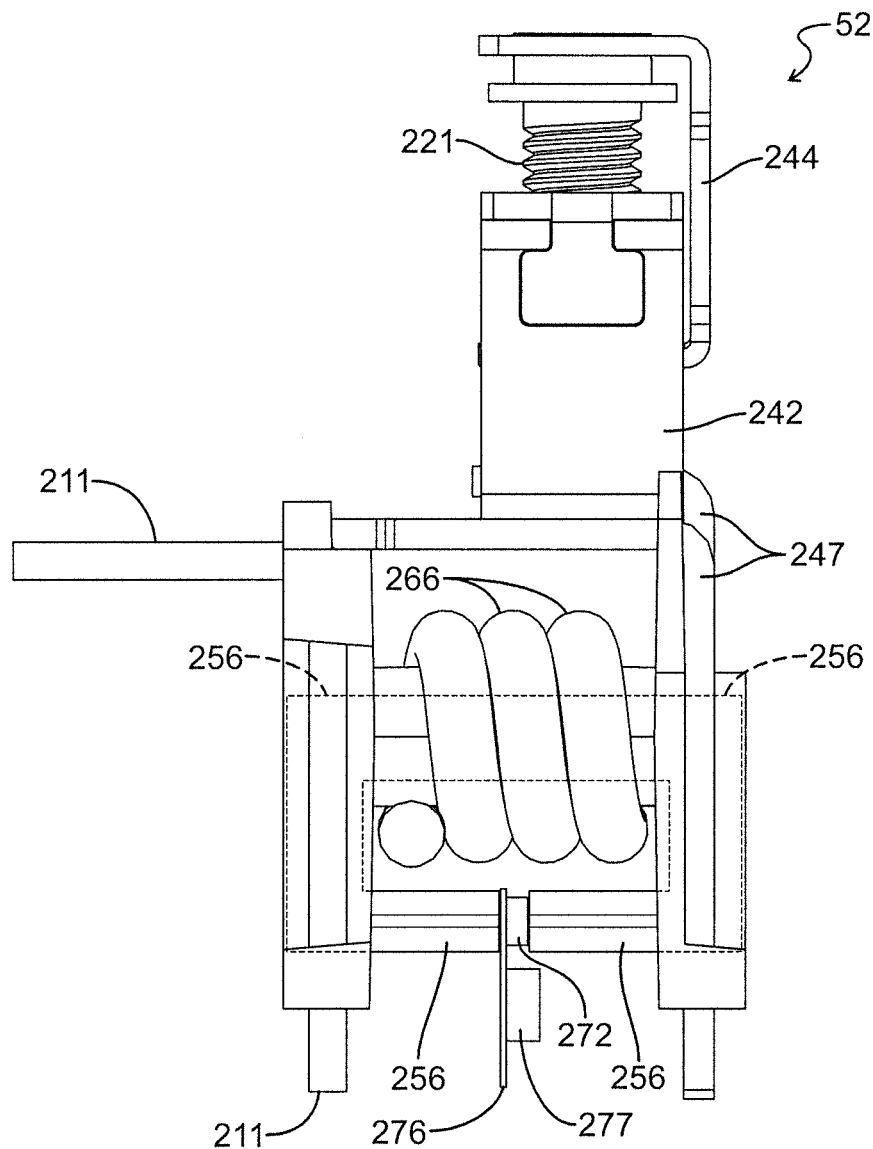
FIG. 19 is a side view illustrating the current sensing element of FIG. 10.
Figure 20:
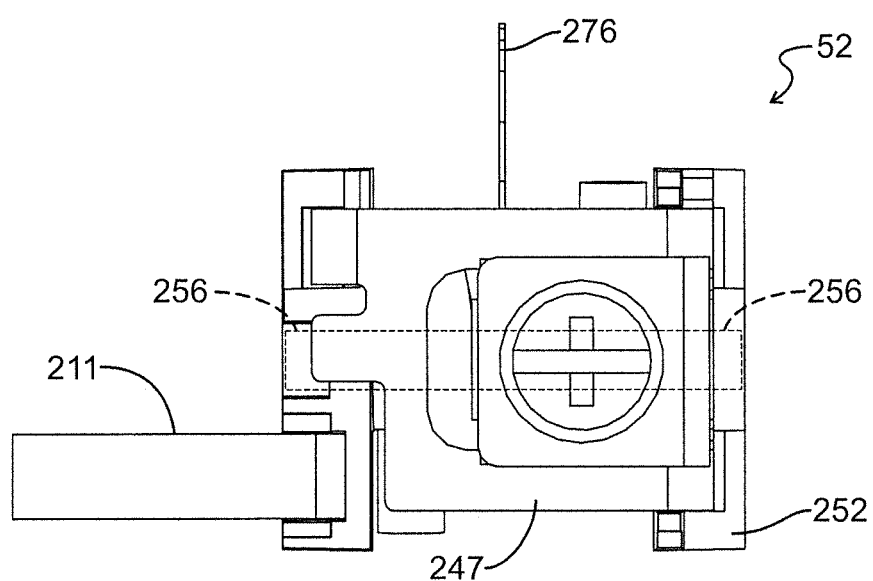
FIG. 20 is a top view illustrating the current sensing element of FIG. 10.

FIG. 15 depicts an exemplary voltage dividing circuit 325 that may be used to implement the high voltage sensor 168. The circuit 325 has thirty-four resistors R108-R141 that are coupled in series to a node 331. The circuit 325 also has ten populated resistors R142-R151 that are coupled in parallel to the node 331. Further, an operational amplifier 333 is coupled through a resistor R153 to the node 331, and the resistor R108 is coupled to the bus bar 84. An analog signal at the node 331 has a voltage that represents a scaled-down version of the voltage the bus bar 84. The amount of scaling is dependent on the ratio of the effective resistance of the series resistors R108-R141 and the effective resistance of the parallel resistors R142-R151. In the embodiment shown by FIG. 15, the voltage of the analog signal is equal to $V_{in}(R_2)/(R_1+R_2)$, wherein $V_{in}$ is equal to the voltage of the bus bar, $R_1$ is the effective resistance of the series resistors R108-R141, and $R_2$ is the effective resistance of the parallel resistors R142-R151. As used herein, the "scaling ratio" is equal to $V_{in}/V_{out}$, which in the circuit 325 is equal to $(R_1+R_2)/R_2$. The analog signal is filtered by the resistor R153 and capacitor C29 before being buffered by the operational amplifier 333. The output of the operational amplifier 333 is converted from analog to digital by an analog-to-digital (A/D) converter (not shown) in order to provide a digital value indicative of the voltage of the bus bar 84. In other embodiments, other numbers of resistors may be used and other types of circuits may be used to sense the voltage of the bus bar 84.

In one exemplary embodiment, the resistance of each resistor in the high voltage sensor 168 is substantially equal. In the exemplary embodiment shown by FIG. 15, each resistor has a resistance of 221 kilo-Ohms, but other resistances are possible in other embodiments. Having substantially equal resistances helps to compensate for variations in the characteristics of the resistors so that more accurate readings are obtained. For example, the performance or resistance of each resistor may slightly vary with temperature. By using resistors of substantially equal resistances, it is more likely that the variations will be uniform such that even if the resistances do vary, the overall ratio of the effective resistance of the series resistors R108-R141 to the effective resistance of the parallel resistors R142-R151 remains substantially the same resulting in more accurate and reliable voltage readings.

Further, by using resistors with the exact same resistance, the resistors may be taken from the same reel sold by the manufacturer of the resistors. Resistors coming from the same reel are typically made from the same batch of materials such that they have similar performance characteristics and, in particular, variations in temperature. Moreover, using resistors from the same reel helps to provide a more accurate and reliable voltage reading.

In one exemplary embodiment, the configuration of the circuit 325 is controlled such that it is unnecessary for the control logic 163 to perform floating point calculations on the output of the A/D converter in order to determine the voltage of the bus bar 84. In this regard, a reference voltage of the A/D converter is selected that it is evenly divisible into the value of $2^{(n-1)}$, where n is the bit length of the A/D converter output. This provides an integer value for the scaling ratio according to the equation of $2^{(n-1)}/V_{ref}$, where $V_{ref}$ is the reference voltage of the A/D converter. For example, for a 10 bit A/D converter, where n is equal to 10, the scaling ratio for a 3.0 V reference voltage is 341, an integer value. Such a circuit would be capable of measuring a voltage of the bus bar 84 from 0 up to 1023 Volts without saturating.

After determining a suitable reference voltage and scaling ratio, which is $V_{in}/V_{out}$, the number of resistors for the circuit 325 is selected based on the equation: scaling ratio= $(S \times P)+1$, where S is the number of resistors in series (i.e., the number of resistors R108-R141 in the example of FIG. 15) and P is the number of resistors in parallel (i.e., the number of resistors R142-R151 in the example of FIG. 15). Note that the values picked for S and P should be integers since they represent a number of resistors. For instance, in the above example where the reference value is 3.0 Volts and the scaling ratio is 341, a user may pick a value of 10 for P. In such case, the value of S is 34. Thus, by using 34 resistors in series and 10 resistors in parallel where each resistor has the same resistance, it is unnecessary for the control logic 163 to perform scaling, which could involve floating point calculations to determine the voltage of the bus bar 84. In the given example, each increment of the value output from the A/D converter represents 1 Volt. Note that it is unnecessary for each increment to represent a voltage value that is an integer. In this regard, it is well known that shift registers may be used to determine increments that are fractions of a Volt where the fraction is equal to $\frac{1}{2^x}$, where x is an integer.

FIGS. 16-20 depict various perspectives of the current sensing element depicted by FIG. 10. It should be emphasized that the embodiments described herein are exemplary, and it would be apparent to one of ordinary skill upon reading this disclosure that various changes and modifications to the embodiments described herein are possible.

Now, therefore, the following is claimed:

1. A method for providing current sensing elements for use in applications associated with different peak current levels, comprising:

providing a plurality of current sensing elements including at least a first current sensing element and a second current sensing element, the first current sensing element having a first magnetic sensor and first circuitry for carrying a signal from the first magnetic sensor, the second current sensing element having a second magnetic sensor and second circuitry for carrying a signal from the second magnetic sensor, wherein the first magnetic sensor is configured to sense a magnetic flux generated by magnetic material around which a first conductive coil is wrapped for a first number of turns, wherein the second magnetic sensor is configured to sense a magnetic flux generated by magnetic material around which a second conductive coil is wrapped for a second number of turns, wherein a design of electrical components of the first circuitry is the same as a design of electrical components of the second circuitry, wherein the first number of turns is different than the second number of turns such that the electrical components of the first circuitry saturate at a first level of current passing through the first conductive coil, wherein the first level of current is different than a second level of current passing through the second conductive coil at which the electrical components of the second circuitry saturate;

selecting the first current sensing element for use in an application for which a peak level of current expected to pass through the first conductive coil is less than the first level of current, wherein the selecting the first current sensing element is based on the peak level of current expected to pass through the first conductive coil; and selecting the second current sensing element for use in an application for which a peak level of current passing through the second conductive coil is less than the second level of current, wherein the selecting the second current sensing element is based on the peak level of current expected to pass through the second conductive coil.

2. The system of claim 1, wherein the selecting the first current sensing element is performed such that the first conductive coil has a maximum number of turns without saturating the electrical components of the first circuitry when current at the first level is passing through the first conductive coil.

3. The system of claim 2, wherein the selecting the second current sensing element is performed such that the second conductive coil has a maximum number of turns without saturating the electrical components of the second circuitry when current at the second level is passing through the second conductive coil.

4. The system of claim 1, wherein current at the second level passing through the first conductive coil causes the electrical components of the first circuitry to saturate.

* * * * *